United States Patent
Taylor et al.

(10) Patent No.: US 6,775,636 B2
(45) Date of Patent: Aug. 10, 2004

(54) AUTOMATED TESTING OF HYBRID ACTUATOR

(75) Inventors: Russell Taylor, Southhampton (GB); Carl German, Nantwich (GB)

(73) Assignee: Siemens Aktiengesellschaft, Munich (DE)

(*) Notice: Subject to any disclaimer, the term of this patent is extended or adjusted under 35 U.S.C. 154(b) by 481 days.

(21) Appl. No.: 09/966,744

(22) Filed: Oct. 1, 2001

(65) Prior Publication Data

US 2002/0047719 A1 Apr. 25, 2002

(30) Foreign Application Priority Data

Sep. 29, 2000 (EP) .............................. 00308595

(51) Int. Cl.[7] .......................... G01L 25/00; H01L 21/00
(52) U.S. Cl. .......................... 702/114; 702/113; 338/33
(58) Field of Search ................................ 702/108, 113, 702/114, 124

(56) References Cited

U.S. PATENT DOCUMENTS 6,283,368 B1 * 9/2001 Ormerod et al. ............ 235/380

FOREIGN PATENT DOCUMENTS

WO      WO98/37557      8/1998

* cited by examiner

Primary Examiner—John Barlow
Assistant Examiner—Meagan S Walling
(74) Attorney, Agent, or Firm—Crowell & Moring LLP

(57) ABSTRACT

There is provided a testing apparatus (200) for a hybrid indicator lens and potentiometer actuator (100). The hybrid actuator (100) serves both as a knob for a potentiometer (120) and as a lens to convey light from an indicator arrangement (110). The test apparatus (200) includes a rotatable test head (204) having a light sensing means (210) and an engaging portion (202). The engaging portion (202) engages with a corresponding receiving recess (102) provided on a head portion (114) of said hybrid actuator (100) and thereby aligns the light sensing means (210) with the hybrid actuator (100). The testing apparatus (200) performs automated tests which include rotation of the hybrid actuator (100), and therefore the potentiometer (120) to a range of test settings and inspection of the functionality of the indicator lens arrangement (110).

7 Claims, 3 Drawing Sheets

AUTOMATED TESTING OF HYBRID ACTUATOR

FIELD OF THE INVENTION

The present invention relates to an apparatus and a method for automated testing of a hybrid actuator.

BACKGROUND TO THE INVENTION

The term hybrid actuator relates to a combined indicator lens and potentiometer actuator as disclosed in a co-pending European Patent Application No. 00308597.4 our file number 2000P05003/EP entitled "Hybrid Actuator" and filed concurrently herewith. In particular, the invention relates to the automated testing of a hybrid actuator disposed in a frequency inverter supplying a variable speed motor, for example a COMBIMASTER [Registered Trademark] 411 combination motor and inverter.

Variable speed motors are used in many settings, for example for driving mechanical handling equipment, for driving electric fans or for powering conveyor belts. Rather than simply varying the voltage applied to a motor, it has been found more efficient to use frequency inverters to convert mains electricity into a variable, three phase power supply.

Variation of the speed of operation of variable speed motor can be achieved through the rotation of an external knob which engages an internal potentiometer. It is often advantageous that adjustment of the speed of operation be as simple as possible and as a result the knob can be arranged to be operable by hand or by means of a coin or a screwdriver. The rotational adjustment may also be imparted by means of a dedicated tool.

The inverter can be in a number of different operational states, for example normal operation, malfunction and test mode. To indicate the current state, the inverter may be provided with an indicator arrangement. This indicator arrangement may comprise internal indicator lamps, for example light emitting diodes (LEDs), and corresponding indicator ports in a wall of the inverter housing. The provision of an indicator arrangement reduces the need for internal access for inspection and is thus a practical safety feature.

The indicator lamps can be arranged to blink with different patterns corresponding to different operational states. Alternatively indicators may be provided which can generate signals of a variety of colours, for example red for malfunction, green for normal operation. It is possible that a single indicator can produce signals of more than one colour, for example certain light emitting diodes allow the production of light at a number of different wavelengths. Naturally other signals can be used to indicate operational states for example audible signals from a loudspeaker.

Of great importance in the reliable operation of electrical devices, inverters included, is isolation from undesirable material. Dust and water can cause particular problems and standards have evolved which detail the degree to which a device is proof against the ingress of water and dust. The environmental protection achieved by frequency inverters is graded along an index of protection (IP) wherein the protection against dust is graded along one scale and against water on another scale, for example an IP rating IP56 corresponds to 5 on the dust scale (ranging from no protection—0 to total protection—6) and 6 on the water scale (ranging from no protection—0 to protection against continuous submersion—8).

For each indicator port and potentiometer adjustment knob port in an inverter's housing the index of protection for the whole inverter is marginally more compromised. If the number of possible ingress points can be reduced a higher IP rating can be attained. In the co-pending European Patent Application No. 00308597.4 discussed above (Attorney Docket Number 2000P05003/EP), there is disclosed an inverter having a single ingress point for a hybrid actuator. The hybrid actuator can be rotated to impart an adjustment upon a potentiometer. Furthermore the hybrid actuator is made of a transparent material to allow the light from an internal indicator lamp to be visible through the single ingress point.

The hybrid actuator can be tested manually by turning the actuator to a number of predetermined positions and confirming that the inverter performs satisfactorily. The manual test then requires that the indicator arrangement be inspected to ensure that the various possible states of the inverter are correctly displayed through the lensing function of the hybrid actuator. Finally the manual test must ensure that the hybrid actuator is returned to a minimum potentiometer setting to avoid damage when the inverter is first used.

Manual testing is performed by a production operative. The production operative often has many other tasks apart from testing. The drawbacks of manual testing thus include: human error; inconsistent testing criteria; added time overheads (for both the production operative performing the test and for the additional time the inverter is in production); and interruption of other non-testing tasks.

OBJECT OF THE INVENTION

The present invention seeks to overcome the problems arising in the testing of hybrid actuators.

STATEMENT OF THE INVENTION

In accordance with one aspect of the present invention, there is provided a testing apparatus for testing an electrical device comprising: a housing; a rotatable control means; an indicator arrangement; and a hybrid actuator, the hybrid actuator being substantially transparent to allow light from the indicator arrangement to be observed from outside the housing, the hybrid actuator being operable to engage with the rotatable control means and whereby to enable rotation about an axis; characterised in that the test apparatus includes: a rotatable test head which has an engaging portion for engaging a head portion of said hybrid actuator; a light sensing means; a processing means for receiving sensed light data from the light sensing means, for receiving performance data from the electrical device and for controlling the movement of the rotatable test head; and a drive means for driving the rotatable test head about the axis in accordance with a control signal generated by the processing means. It is preferred that the light sensing means is provided upon the rotatable test head.

A light sensing means may be provided either on the rotatable test head or close enough to the rotatable test head to be able to monitor light emitted by the hybrid actuator. In one possible arrangement the light sensing means may be provided behind the rotatable test head and the rotatable test head may be substantially transparent thereby allowing light to penetrate through to the light sensing means. In another possible arrangement, the light sensing means is disposed in a non-rotating axial portion of the rotatable test head and a remaining radial portion of the rotatable test head rotates about the axial portion.

Preferably, the engaging portion of the rotatable test head engages with a corresponding receiving recess provided on the head portion and thereby aligns the light sensing means with the hybrid actuator.

The light sensing means advantageously monitors light emitted by the indicator arrangement.

In a preferred embodiment, the electrical device is an inverter, the rotatable control means is a potentiometer and the indicator arrangement is a light emitting diode. Here the performance data received from the inverter may be a sample of the output voltage of the inverter.

Automated testing of the hybrid actuator gives a great improvement over manual testing since a high level of quality can be maintained with the minimum of additional testing time and production operative attention.

In a further aspect of the present invention there is provided a method for testing an electrical device comprising: a housing; a rotatable control means; an indicator arrangement; and a hybrid actuator, the hybrid actuator being substantially transparent to allow light from the indicator arrangement to be observed from outside the housing, engaging with the rotatable control means and rotating about an axis; the method characterised by the steps of: providing a test apparatus which includes: a rotatable test head; a light sensing means; a drive means; and a processing means for controlling the movement of the rotatable test head; engaging the rotatable test head with a head portion of the hybrid actuator; driving the rotatable test head about the axis into a plurality of different testing positions in accordance with a control signal generated by the processing means; in each of the different testing positions, monitoring performance data for the electrical device; monitoring the light emanating from the hybrid actuator, the light sensing means sensing the light emanating from the hybrid actuator and generating sensed light data; and receiving and processing the sensed light data and the performance data and generating a report of the received data.

BRIEF DESCRIPTION OF THE FIGURES

The invention may be understood more readily, and various other aspects and feature of the invention may become apparent from consideration of the following description and the figures as shown in the accompanying drawing sheets, wherein.

DETAILED DESCRIPTION OF THE INVENTION

There will now be described, by way of example, the best mode contemplated by the inventors for carrying out the invention. In the following description, numerous specific details are set out in order to provide a complete understanding of the present invention. It will be apparent, however, to those skilled in the art, that the present invention may be put into practise with variations of this specific.

Prior art inventors have independent potentiometer knobs and indicator ports. However independent potentiometer knobs and indicator ports inevitably require a corresponding number of independent access ports. The more access ports the more difficult it is to maintain a high IP rating.

Figure 1:
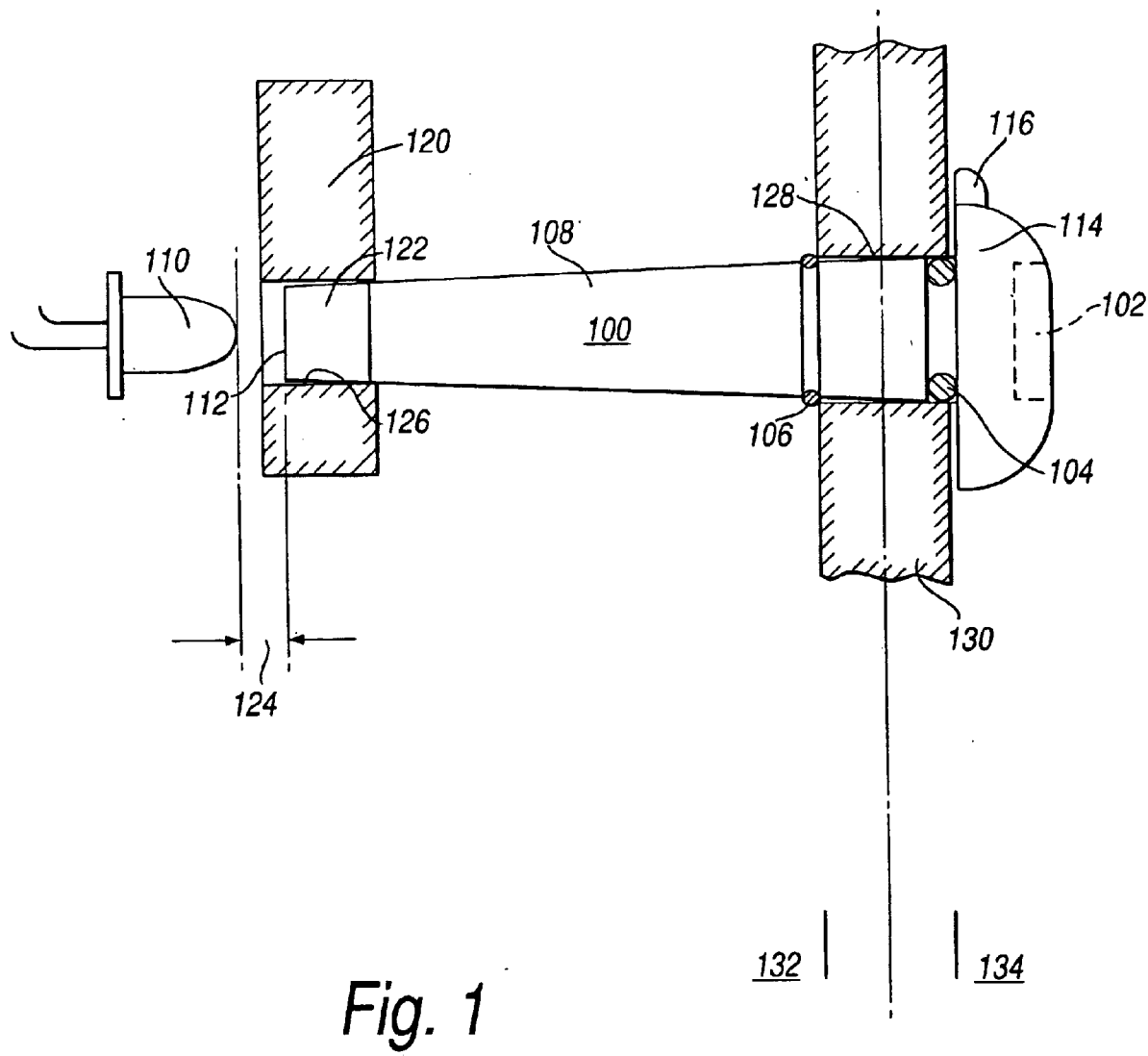
FIG. 1 shows a hybrid actuator as described in the co-pending European Patent Application No. 00308597.4 discussed above.

FIG. 1 illustrates a portion of an inverter as described in the co-pending European Application Patent Application No. 00309597.4 discussed above. The inverter has a housing 130 within which are arranged a hybrid actuator 100, a light emitting diode 110 and a potentiometer 120. The hybrid actuator 100 has a head portion 114 outside the inverter housing 130 and a shaft portion 108 within the housing 130.

A tip 112 of the shaft portion 108 is arranged to be adjacent to the LED 110 with a small gap 124 therebetween. In further embodiments of the hybrid actuator 100, the small gap 124 may be absent. The hybrid actuator 100 is made of a substantially transparent material, for example plastic or toughened glass, and thus light emitted by the LED 110 is conveyed from the LED 110 to the outside of the inverter via a "light tube" defined by the shaft portion 108 and the head portion 114 of the hybrid actuator 100. To facilitate efficient passage of light through the shaft portion 108, the surfaces of the shaft portion 108 are made reflective whilst the outer surface of the head portion 114 is roughened to disperse any light originating within the inverter housing 130.

The end of the shaft portion 108 is provided with an engaging surface 122, for engaging with a corresponding receiving portion 126 of the potentiometer 120. When the head portion 114 of the hybrid actuator 100 is rotated from outside the inverter housing 130, the rotational movement thus acts upon the potentiometer 120 and the speed of the motor is adjusted accordingly. It will be understood that the engaging surface 122 and the corresponding receiving portion 126 may take a variety of known forms from a simple key and key-hole arrangement to an arrangement where the engaging surface 122 and the receiving portion 126 are both provided with interlocking fingers or hooks.

The head portion 114 of the hybrid actuator 100 is provided with an adjustment slot 102 and a wiper 116. The adjustment slot 102 is arranged to allow an adjustment tool, for instance a coin, a screwdriver or a dedicated, automated rotating test head, to be inserted therein and thereby cause the hybrid actuator to rotate.

To complete an environmental seal between the inside 132 and the outside 134 of the inverter housing 130, a sealing O-ring 104 is provided. The sealing O-ring 104 prevents the ingress of water and or dust particles even when the hybrid actuator 100 is rotated and is disposed within a port hole 128 in the inverter housing 130. A further retaining O-ring 106 is disposed at the inner rim of the port hole 128 and serves to retain the hybrid actuator 100 in axial position as well as supplementing the sealing function of the sealing O-ring 104.

Figure 2:
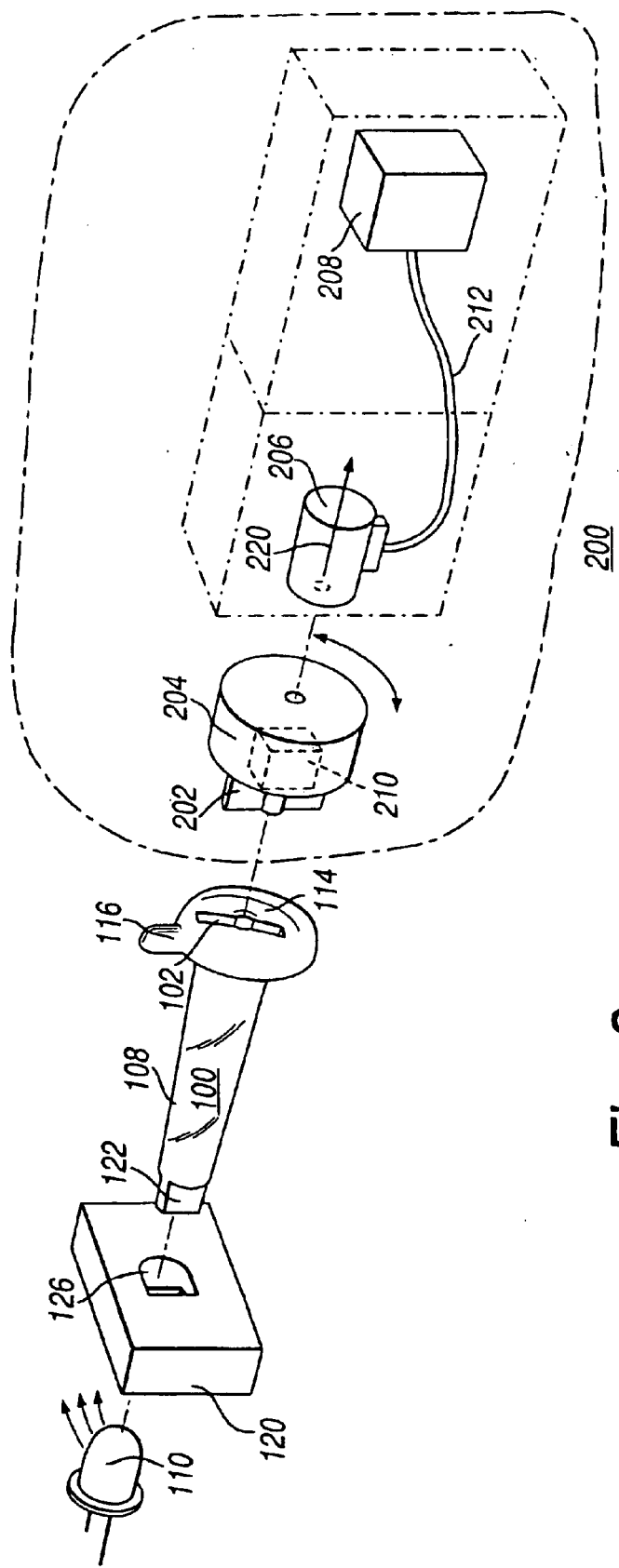
FIG. 2 shows an apparatus according to the present invention for testing inverters having hybrid actuators as shown in FIG. 1.

FIG. 2 illustrates the relation between the hybrid actuator 100 and a testing apparatus 200. The testing apparatus 200 comprises a rotatable test head 204, processing means 208 and drive means 206. The drive means 206 applies a torque which drives the rotatable test head 204 in accordance with a control signal 212 generated by the processing means 208. The processing means 208 may be a general purpose computer carrying out a set of programmed test instructions and relaying corresponding control signals to the drive means 206. Alternatively the processing means 208 may be a component of an application specific integrated circuit having storage means (not shown) and the processing means 208 operates in accordance with instructions stored on the storage means.

It will be understood that the testing apparatus 200 must derive energy from a power supply. Examples of possible power supplies include mains electricity and battery power (not shown). The hybrid actuator 100 and the rotatable test head 204 both rotate about an axis 220. The rotatable test head 204 is provided with an engaging portion 202 and a light sensing means 210. The engaging portion 202 engages with the adjustment slot 102 on the hybrid actuator 100 thereby allowing the testing apparatus 200 to impart a rotation to the potentiometer 120 by means of the rotatable test head 204 and the hybrid actuator 100.

The light sensing means 210, for example a charged coupled detector or a photoresistor, is used to check the light emanating from an indicator arrangement, for example the LED 110, for brightness, colour and functionality. Not only must the light emanating from the hybrid actuator 100 be visible, the pattern of indications generated by the light, for example sequences of short and long flashes or blinking, must be consistent with the operational state of the inverter as a whole. When the indicator arrangement generates light of different wavelengths, the light sensing means 210 can be arranged to distinguish between the different wavelengths.

Light sensing means 210 may comprise a photocell. However, it will be appreciated that other light sensing means may be employed.

The engaging portion 202 of the rotatable test head 204 is rotatable throughout a range of positions corresponding to permitted potentiometer settings. At the end of each test session the rotatable test head 204 returns the potentiometer 120 to the lowest setting to prevent damage upon first usage.

The testing of the operation of the potentiometer 120 and of the indicator arrangement 110 can thus be performed through testing of the hybrid actuator 100 as it operates as a potentiometer knob and as an indicator lens respectively. Furthermore the testing of the hybrid actuator 100 can be automated.

Figure 3:
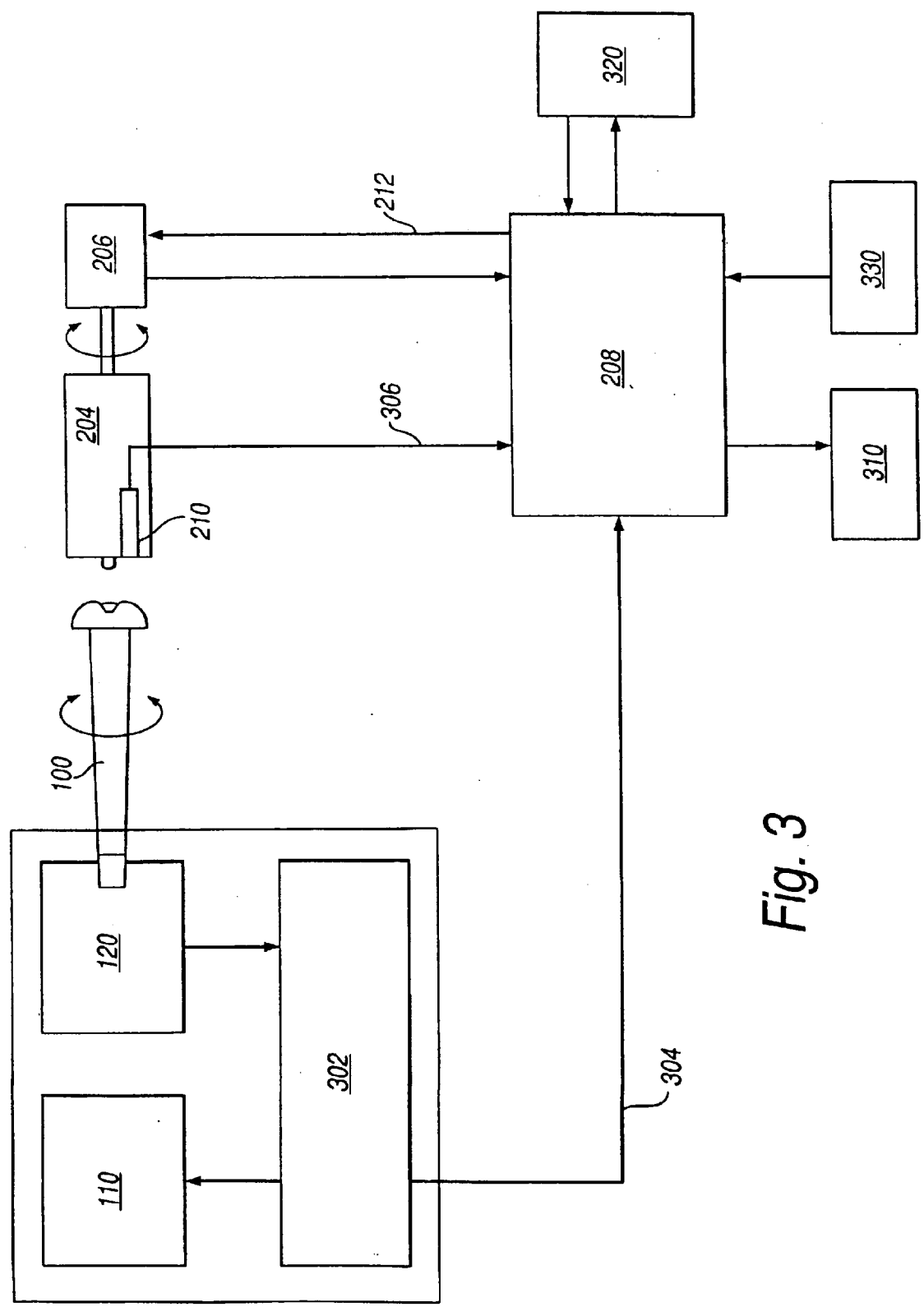
FIG. 3 shows a schematic diagram of the apparatus of FIG. 2.

FIG. 3 illustrates the apparatus of FIG. 2 in a more schematic form. The processing means 208 receives inverter performance data 304 and sensed light data 306 from an inverter performance sensing means 302 and the light sensing means 210 respectively. Examples of inverter performance sensing means 302 include a voltmeter which monitors the output voltage signal generated by the inverter, an ammeter which monitors the output current produced by the inverter, and a frequency meter for monitoring the output frequency produced by the inverter.

Control signals 212 are generated by the processing means 208 in accordance with a set of instructions and transmitted to the drive means 206. Advantageously, the processing means 208 may be arranged to monitor the performance of the drive means 206.

It will be understood that the processing means 208 will be associated with a variety of conventional peripheral devices. Information, for instance the testing program, may be stored and retrieved by the processing means 208 from a storage means 320. Conventional storage means include hard disks, read only memory and random access memory. Further input can be directed to the processing means 208 by means of an input device 330, for example a keypad or a light pen. Similarly the processing means 208 can be arranged to generate a report by means of an output device 310, for example a printer, a display or a loudspeaker.

What is claimed is:

1. A testing apparatus (200) for testing an electrical device comprising:

a housing (130); a rotatable control means (120); an indicator arrangement (110); and a hybrid actuator (100), the hybrid actuator (100) being substantially transparent to allow light from the indicator arrangement (110) to be observed from outside the housing (130), the hybrid actuator (100) being operable to engage with the rotatable control means (120) and whereby to enable rotation about an axis (220);

characterised in that the test apparatus (200) includes:

a rotatable test head (204), which has an engaging portion (202) for engaging a head portion (114) of said hybrid actuator (100);

a light sensing means (210);

a processing means (208) for receiving sensed light data from the light sensing means (210), for receiving performance data from the electrical device and for controlling the movement of the rotatable test head (204); and a drive means (206) for driving the rotatable test head (204) about the axis (220) in accordance with a control signal (212) generated by the processing means (208).

2. A testing apparatus according to claim 1, wherein the light sensing means (210) is provided upon the rotatable test head (406).

3. A testing apparatus according to claim 1, wherein the light sensing means (210) is provided upon the rotational test head, wherein the engaging portion (202) of the rotatable test head (204) engages with a corresponding receiving recess (102) provided on the head portion (114) and thereby aligns the light sensing means (210) with the hybrid actuator (100).

4. A testing apparatus according to claim 1, wherein the light sensing means (210) monitors light emitted by the indicator arrangement (110).

5. A testing apparatus according to claim 1, wherein the electrical device is an inverter, the rotatable control means (120) is a potentiometer and the indicator arrangement (110) is a light emitting diode.

6. A testing apparatus according to claim 5, wherein the performance data received from the inverter is a sample of the output voltage of the inverter.

7. A method for testing an electrical device comprising: a housing (130); a rotatable control means (120); an indicator arrangement (110); and a hybrid actuator (100), the hybrid actuator (100) being substantially transparent to allow light from the indicator arrangement (110) to be observed from outside the housing (130), engaging with the rotatable control means (120) and rotating about an axis (220); the method characterised by the steps of:

providing a test apparatus which includes: a rotatable test head (204); a light sensing means (210); a drive means (206); and a processing means (208) for controlling the movement of the rotatable test head (204);

engaging the rotatable test head (204) with a head portion (114) of the hybrid actuator (100);

driving the rotatable test head (204) about the axis (220) into a plurality of different testing positions in accordance with a control signal (212) generated by the processing means (208);

in each of the different testing positions, monitoring performance data (304) for the electrical device;

monitoring the light emanating from the hybrid actuator (100), the light sensing means (210) sensing the light emanating from the hybrid actuator (100) and generating sensed light data (306); and receiving and processing the sensed light data (306) and the performance data (304) and generating a report of the received data.

* * * * *